(12) United States Patent
Liu et al.

(10) Patent No.: US 11,696,419 B2
(45) Date of Patent: Jul. 4, 2023

(54) HEAT DISSIPATION DEVICE

(71) Applicant: AEWIN TECHNOLOGIES CO., LTD., New Taipei (TW)

(72) Inventors: Cheng-En Liu, New Taipei (TW); Bing-Siang Tseng, New Taipei (TW)

(73) Assignee: AEWIN TECHNOLOGIES CO., LTD., New Taipei (TW)

( * ) Notice: Subject to any disclaimer, the term of this patent is extended or adjusted under 35 U.S.C. 154(b) by 233 days.

(21) Appl. No.: 17/378,773

(22) Filed: Jul. 19, 2021

(65) Prior Publication Data

US 2022/0322568 A1     Oct. 6, 2022

(30) Foreign Application Priority Data

Apr. 6, 2021   (TW) ................................ 11011236.0

(51) Int. Cl.
*H05K 7/20*       (2006.01)
*G06F 1/20*       (2006.01)

(52) U.S. Cl.
CPC ......... *H05K 7/20145* (2013.01); *G06F 1/206* (2013.01); *H05K 7/20727* (2013.01)

(58) Field of Classification Search
CPC ............ H05K 7/20145; H05K 7/20727; G06F 1/206; G06F 1/20; Y02D 10/00
See application file for complete search history.

(56) References Cited

FOREIGN PATENT DOCUMENTS

| CN | 103796475 B | * | 4/2016 | |
|---|---|---|---|---|
| CN | 112755679 A | * | 5/2021 | ......... B01D 39/2003 |
| TW | I236336 B | * | 7/2005 | ......... H05K 7/20727 |
| TW | 201223425 A | * | 6/2012 | ......... H05K 7/20727 |
| TW | M471616 U | * | 2/2014 | ............... G06F 1/20 |
| TW | 201422121 A | * | 6/2014 | |
| TW | 201422135 A | * | 6/2014 | |

* cited by examiner

*Primary Examiner* — Emmanuel E Duke
(74) *Attorney, Agent, or Firm* — Resonance IP Law, PC

(57) ABSTRACT

A heat dissipation device is provided and includes a frame body having an airflow channel therein; a first partition plate and a second partition plate for separating the airflow channel into a first channel, a second channel, a third channel and a fourth channel; a first flow guiding structure for isolating the fourth channel from the second channel; and a second flow guiding structure for isolating the first channel from the third channel. The first partition plate, the first flow guiding structure, the second flow guiding structure and the second partition plate collectively form a first flow channel communicating the first channel and the fourth channel and a second flow channel communicating the second channel and the third channel, where the first flow channel and the second flow channel are separate from one another.

10 Claims, 9 Drawing Sheets

HEAT DISSIPATION DEVICE

CROSS-REFERENCE TO RELATED APPLICATIONS

This application claims priority to Taiwan Application Serial No. 110112360, filed on Apr. 6, 2021. The entirety of the above-mentioned patent application is hereby incorporated by reference herein and made a part of this specification.

BACKGROUND

1. Technical Field

The present disclosure relates to heat dissipation devices, and more particularly, to a heat dissipation device applied to electronic elements.

2. Description of Related Art

Along with the development of science and technologies, more and more computers, servers or workstations use a plurality of central processing units (CPUs) to improve the computing speed and thereby meet the demand for large data processing. When a plurality of CPUs operate in a full load state, the temperature is quite high. As such, the CPUs may overheat, thereby causing problems such as system instability or crashing.

To prevent the CPUs from overheating, fans or other heat dissipation devices are usually mounted on the CPUs to dissipate heat. However, the heat dissipation efficiency of the heat dissipation devices is not ideal for the following reasons. Firstly, waste heat generated by a CPU at an upwind position may adversely affect a CPU at a downwind position, thus resulting in a poor heat dissipation efficiency of the CPU at the downwind position. Secondly, due to limited horizontal space, it is not easy to guide wind generated by the heat dissipation devices. As such, airflow cannot be completely utilized, thus decreasing the heat dissipation efficiency. Thirdly, if the heat dissipation devices are customized, the cost will become too high.

Therefore, how to overcome the above-described drawbacks of the prior art has become an urgent issue in the art.

SUMMARY

In view of the above-described drawbacks of the prior art, the present disclosure provides a heat dissipation device, which comprises: a frame body having an airflow channel therein; a first partition plate disposed inside the frame body for separating one side of the airflow channel into a first channel and a second channel; a second partition plate disposed inside the frame body for separating the other side of the airflow channel into a third channel and a fourth channel; a first flow guiding structure laterally disposed at one end of the second partition plate for isolating the fourth channel from the second channel; and a second flow guiding structure laterally disposed at one end of the first partition plate for isolating the first channel from the third channel, wherein the first partition plate, the first flow guiding structure, the second flow guiding structure and the second partition plate collectively form a first flow channel communicating the first channel and the fourth channel and a second flow channel communicating the second channel and the third channel, and wherein the first flow channel and the second flow channel are separate from one another.

In the aforementioned heat dissipation device, each of the first flow guiding structure and the second flow guiding structure has a step-like structure.

In the aforementioned heat dissipation device, the first flow guiding structure and the second flow guiding structure are disposed adjacent to one another, and the step-like structures of the first flow guiding structure and the second flow guiding structure are positioned opposite to one another.

The aforementioned heat dissipation device further comprises a first opening and a second opening formed between the first flow guiding structure and the second flow guiding structure in the first flow channel and the second flow channel, respectively, wherein the first opening and the second opening are aligned along a same vertical direction.

In the aforementioned heat dissipation device, the first flow guiding structure further has a third opening formed in the first flow channel, such that the third opening and the first opening collectively communicate the first channel and the fourth channel.

In the aforementioned heat dissipation device, the first partition plate and the second partition plate are disposed inside the frame body in a direction parallel to airflow of the airflow channel.

In the aforementioned heat dissipation device, at least two CPUs are connected in series and disposed in the first channel and the third channel, respectively, and airflow through the CPU in the first channel does not flow through the CPU in the third channel.

In the aforementioned heat dissipation device, at least two memory modules are connected in series and disposed in the second channel and the fourth channel, respectively, and airflow through the memory module in the second channel does not flow through the memory module in the fourth channel.

The aforementioned heat dissipation device further comprises at least two ventilation devices disposed at two ends of the airflow channel, respectively.

In the aforementioned heat dissipation device, each of the ventilation devices is formed by connecting a plurality of fans in parallel.

Therefore, through the design of the frame body, vertical space can be effectively utilized to guide airflow. As such, waste heat generated by the CPUs at upwind and downwind positions will not adversely affect one another, airflow of the ventilation devices can be completely and effectively utilized, and low air inlet temperature is achieved. Hence, heat dissipation units on the CPUs do not need to be specially designed or customized, thereby effectively reducing cost and facilitating to support CPUs with high power consumption.

DETAILED DESCRIPTION OF THE EMBODIMENTS

The following illustrative embodiments are provided to illustrate the present disclosure, these and other advantages and effects can be apparent to those in the art after reading this specification.

Figure 1:
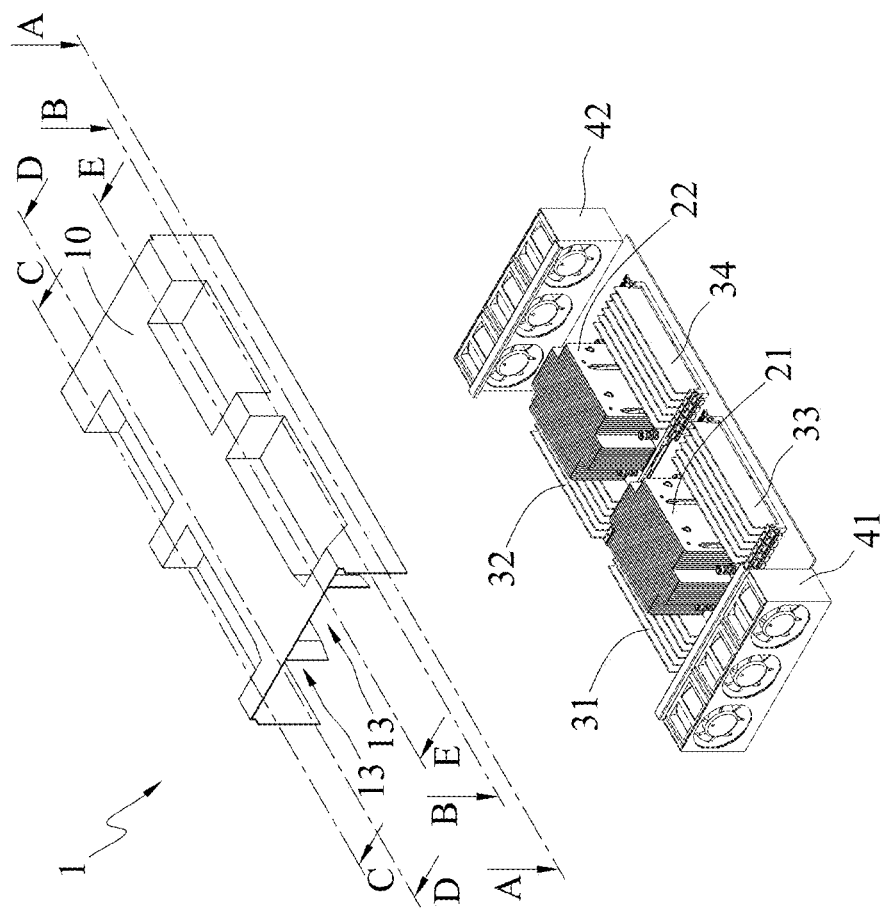
FIG. 1 is a schematic view of a heat dissipation device according to the present disclosure.

FIG. 1 is a schematic view of a heat dissipation device 1 according to the present disclosure. The heat dissipation device 1 has a frame body 10 with an airflow channel 13 therein. In an embodiment, the frame body 10 can cover on CPUs 21, 22 and memory modules 31, 32, 33, 34, and ventilation devices 41 and 42 are disposed at two ends of the airflow channel 13, respectively. The CPUs 21, 22 are connected in series. The memory modules 31, 32, 33, 34 are also connected in series and disposed at two sides of the CPUs 21, 22. Each of the ventilation devices 41, 42 is formed by connecting a plurality of fans in parallel and used to generate airflow in the airflow channel 13 that flows through the CPUs 21, 22 and the memory modules 31, 32, 33. It should be noted that the ventilation devices 41, 42 are removable and provided according to needs. For example, only one of the ventilation devices 41, 42 is provided, or the ventilation devices 41, 42 are provided simultaneously, or the number of the ventilation devices 41, 42 is increased, and the present disclosure is not limited to as such.

Figure 2:
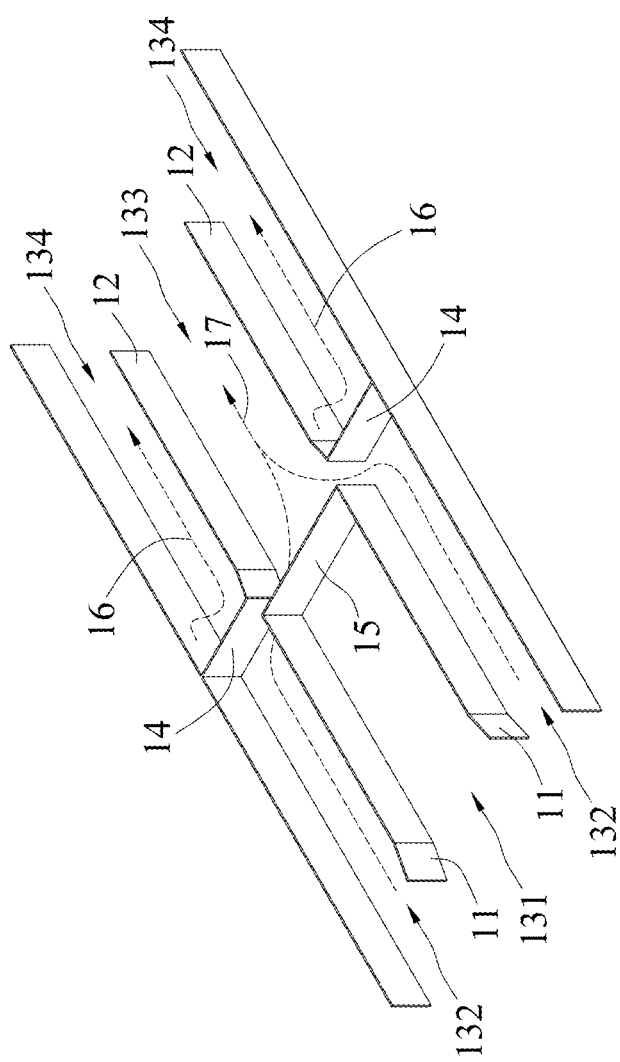
FIG. 2 is a schematic cross-sectional view of a frame body taken along a line A-A of FIG. 1.
Figure 3:
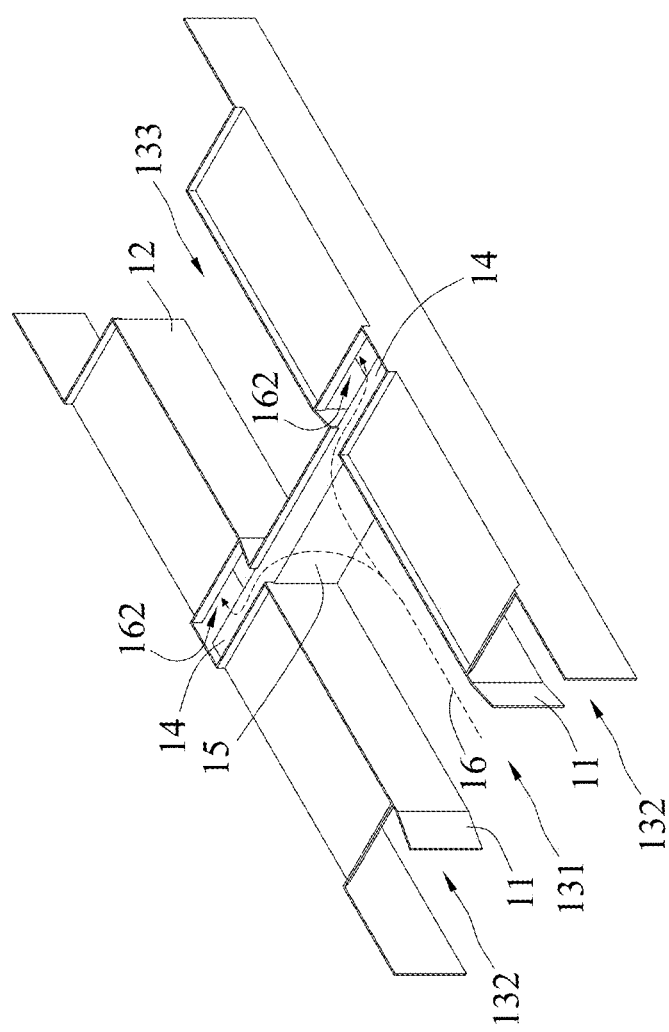
FIG. 3 is a schematic cross-sectional view of the frame body taken along a line B-B of FIG. 1.

Referring to FIGS. 1 to 3, the frame body 10 has a first partition plate 11, a second partition plate 12, a first flow guiding structure 14 and a second flow guiding structure 15 disposed therein. The first partition plate 11 is used to separate one side of the airflow channel 13 adjacent to the ventilation device 41 into a first channel 131 and a second channel 132 and the second partition plate 12 is used to separate the other side of the airflow channel 13 adjacent to the ventilation device 42 into a third channel 133 and a fourth channel 134. In an embodiment, two first partition plates 11 and two second partition plates 12 are provided, and hence two second channels 132 and two fourth channels 134 are obtained. But the present disclosure is not limited thereto. According to practical needs, one or more first partition plates 11 or second partition plates 12 can be provided.

In an embodiment, the first partition plate 11 or the second partition plate 12 is disposed inside the frame body 10 in a direction parallel to the airflow of the airflow channel 13, but the present disclosure is not limited to as such.

In an embodiment, the first flow guiding structure 14 is laterally disposed at one end of the second partition plate 12 so as to isolate the fourth channel 134 from the second channel 132, and the second flow guiding structure 15 is laterally disposed at one end of the first partition plate 11 so as to isolate the first channel 131 from the third channel 133. In an embodiment, the first flow guiding structure 14 connects the second partition plate 12 and an inner side of the frame body 10, and the second flow guiding structure 15 connects one ends of the two first partition plates 11, but the present disclosure is not limited to as such.

Therefore, the first partition plate 11, the second partition plate 12, the first flow guiding structure 14 and the second flow guiding structure 15 collectively form a first flow channel 16 and a second flow channel 17. The first flow channel 16 communicates the first channel 131 and the fourth channel 134, the second flow channel 17 communicates the second channel 132 and the third channel 133, and the first flow channel 16 and the second flow channel 17 are separate from one another. The term "separate" means that the airflow of the first flow channel 16 does not interfere with the airflow of the second flow channel 17.

Figure 4:
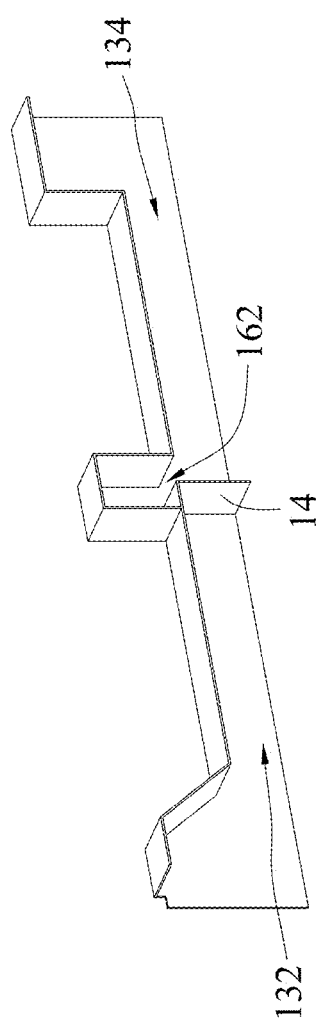
FIG. 4 is a schematic cross-sectional view of the frame body taken along a line C-C of FIG. 1.
Figure 5:
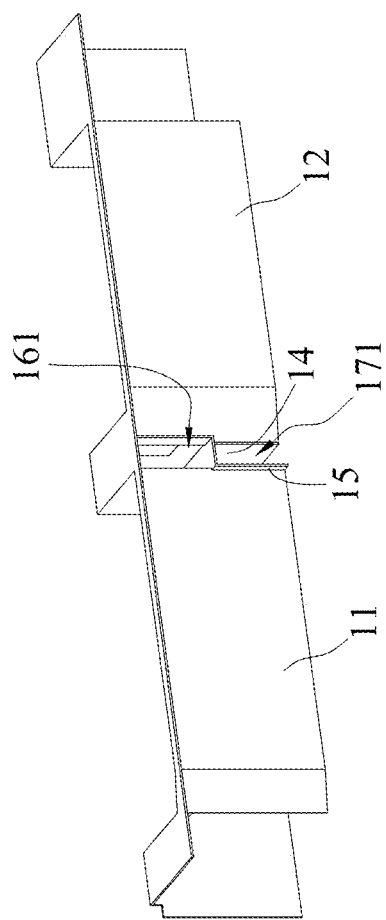
FIG. 5 is a schematic cross-sectional view of the frame body taken along a line D-D of FIG. 1.
Figure 6:
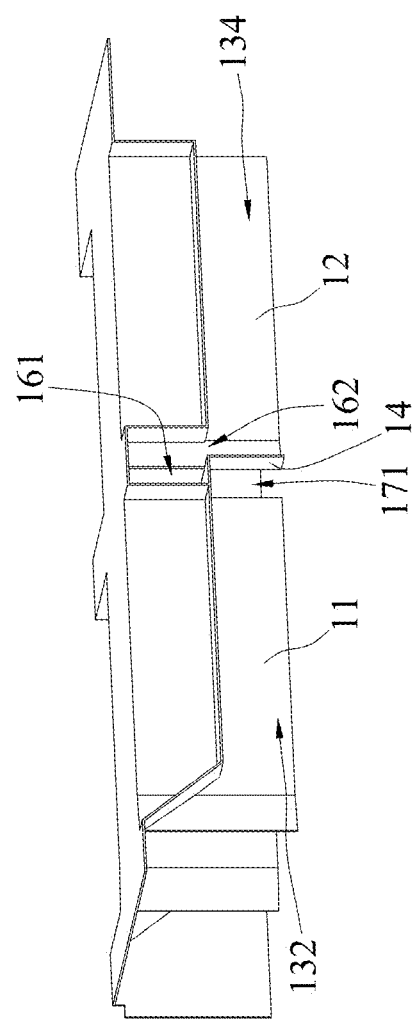
FIG. 6 is a schematic cross-sectional view of the frame body taken along a line E-E of FIG. 1.

Moreover, referring to FIGS. 4 to 6, the first flow guiding structure 14 and the second flow guiding structure 15 are disposed adjacent to one another. As shown in FIGS. 4 and 6, the first flow guiding structure 14 has a step-like structure, and as shown in FIG. 5, the second flow guiding structure 15 also has a step-like structure. But the step-like structures of the first flow guiding structure 14 and the second flow guiding structure 15 are positioned opposite to one another. As such, a first opening 161 and a second opening 171 that are aligned along the same vertical direction (e.g., upper and lower positions) and do not communicate with one another are formed between the first flow guiding structure 14 and the second flow guiding structure 15 and the first partition plate 11 and the second partition plate 12. The first opening 161 is positioned in the first flow channel 16 and the second opening 171 is positioned in the second flow channel 17.

In an embodiment, the first flow guiding structure 14 and the second flow guiding structure 15 can be disposed between the CPU 21 and the CPU 22 so as to cause the first opening 161 and the second opening 171 to be formed between the CPU 21 and the CPU 22. But the present disclosure does not limit the position of the first flow guiding structure 14 and the second flow guiding structure 15.

In an embodiment, the first flow guiding structure 14 further has a third opening 162 formed in the first flow channel 16. Therefore, the third opening 162 and the first opening 161 collectively communicate the first channel 131 and the fourth channel 134 so as to form a complete first flow channel 16. In an embodiment, the third opening 162 can be formed near the step-like structure of the first flow guiding structure 14, and the opening direction of the third opening 162 is different from the opening direction of the first opening 161. But the present disclosure is not limited thereto.

The frame body 10 of the heat dissipation device 1 can cover on the CPUs 21, 22 and the memory modules 31, 32, 33, 34 so as to allow the CPUs 21, 22 to be received in the first channel 131 and the third channel 133 of the frame body 10, respectively, and allow the memory modules 31, 32, 33, 34 to be received in the second channel 132 and the fourth channel 134 of the frame body 10, respectively. When the ventilation devices 41, 42 operate to generate airflow in the airflow channel 13, the airflow through the CPU 21 will not flow through the CPU 22, and the airflow through the memory modules 31, 33 will not flow through the memory modules 32, 34.

In the first flow channel 16, after the airflow generated by the ventilation devices 41, 42 flows into the first channel 131 and absorbs heat energy of the CPU 21, it is guided by the second flow guiding structure 15 to flow through the first opening 161 and then guided by the first flow guiding structure 14 to flow through the third opening 162 so as to flow into the fourth channel 134 where the memory modules 32, 34 are located. As such, waste heat generated by the CPU 21 at the upwind position will not flow through the CPU 22 at the downwind position. Further, in the second flow channel 17, after the airflow generated by the ventilation devices 41, 42 flows into the second channel 132 where the memory modules 31, 33 are located, it is guided by the first flow guiding structure 14 to flow through the second opening 171 and then flows into the third channel 133 where the CPU 22 is located. Compared with the CPU 22, the memory modules 31, 33 have lower power and will not generate a lot of waste heat. Therefore, the airflow in the second channel 132 can maintain a low temperature so as to facilitate subsequent absorption of heat energy generated by the CPU 22. Hence, the heat dissipation efficiency of the CPU 22 at the downwind position will not be adversely affected by waste heat of the CPU 21 at the upwind position.

Figure 7:
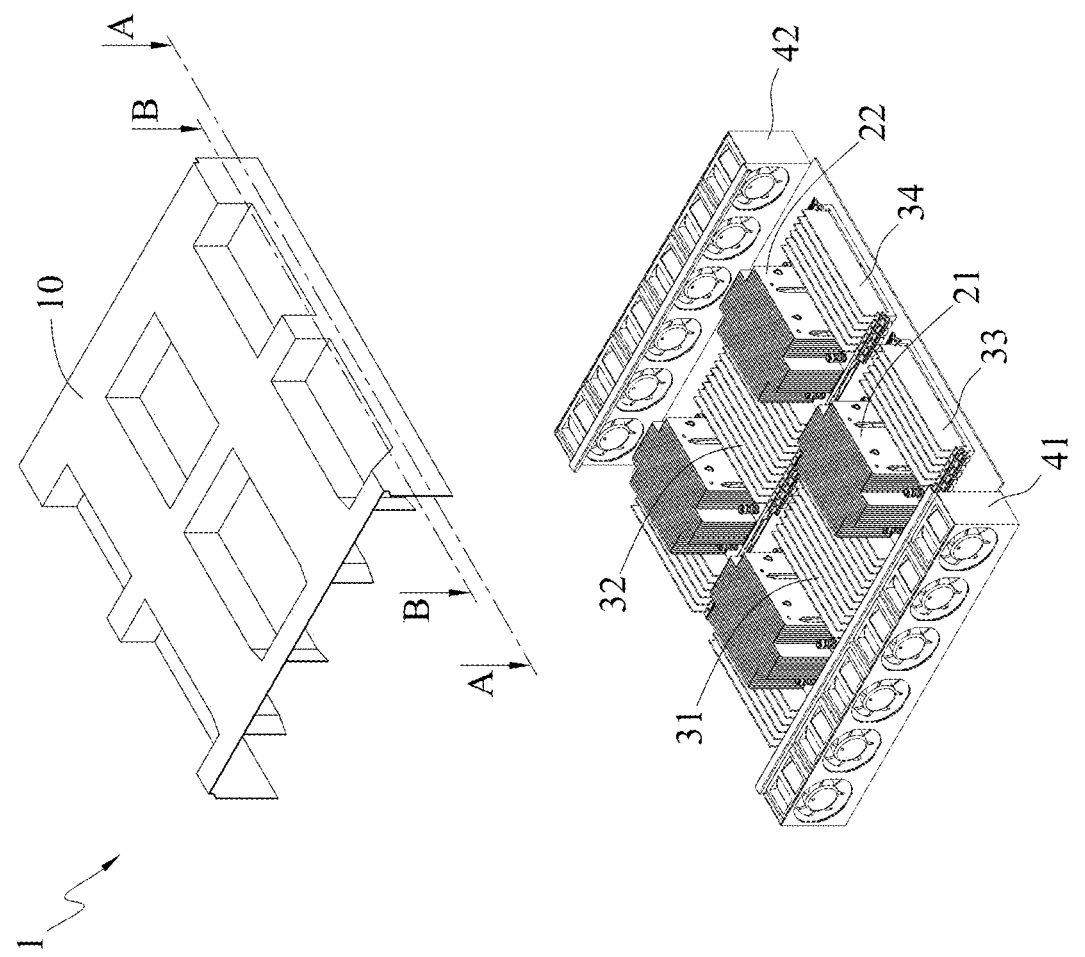
FIG. 7 is a schematic view of a heat dissipation device according to another embodiment of the present disclosure.
Figure 8:
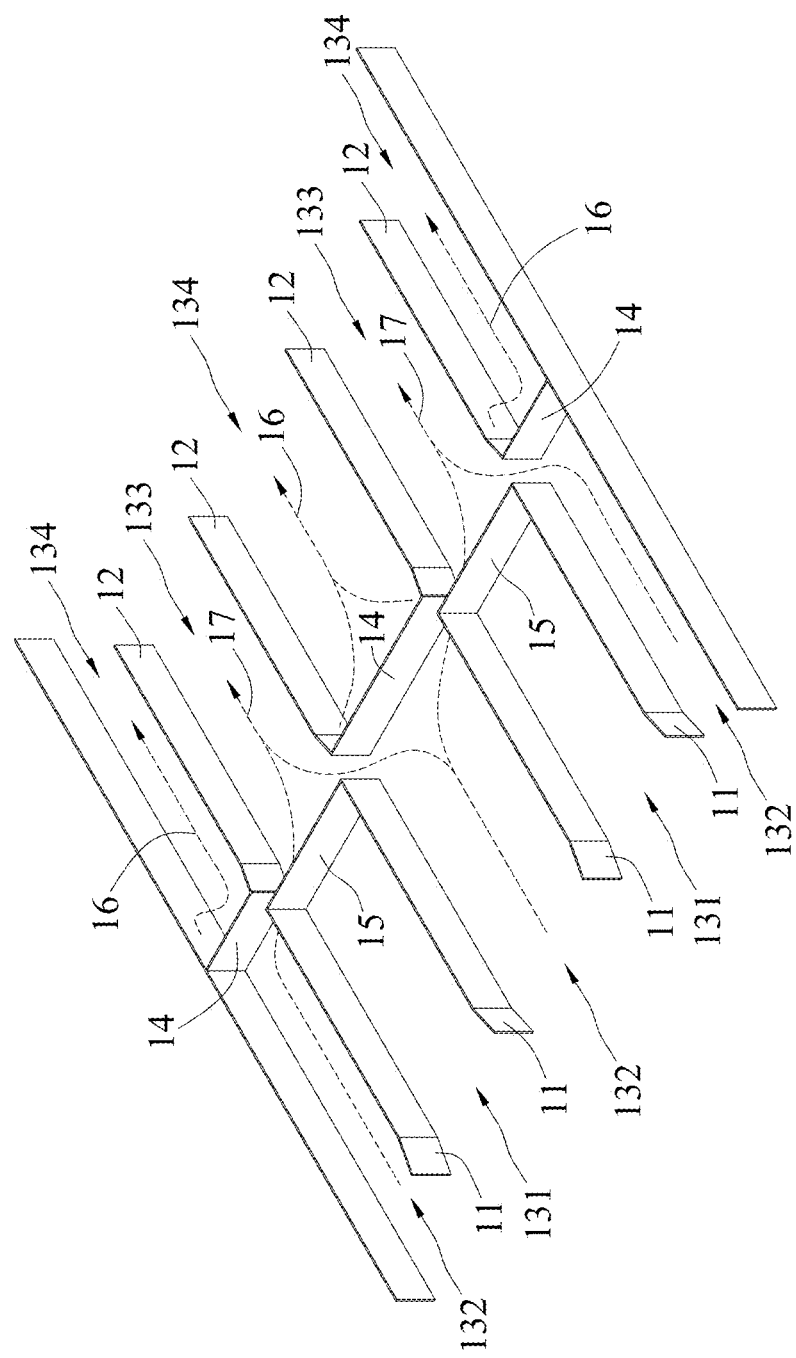
FIG. 8 is a schematic cross-sectional view of a frame body taken along a line A-A of FIG. 7.
Figure 9:
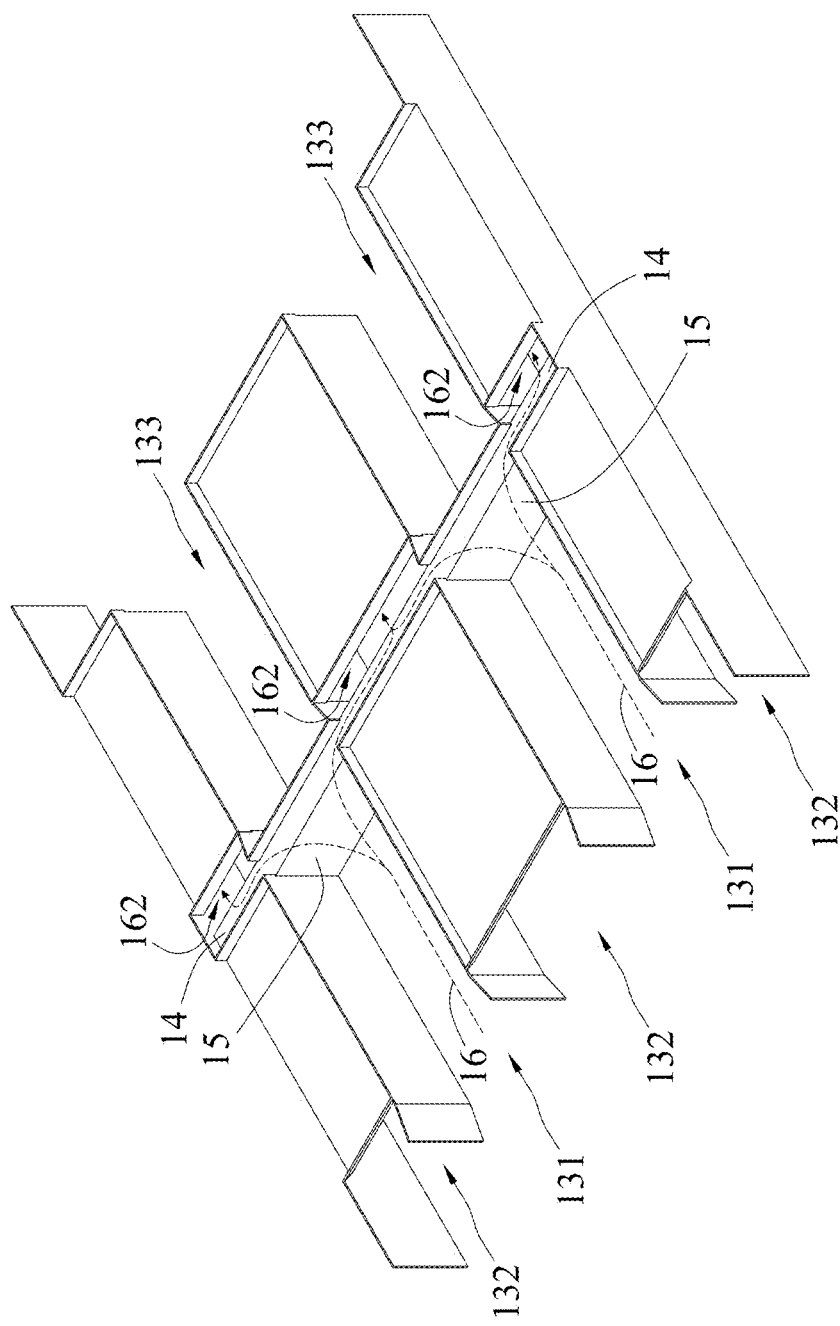
FIG. 9 is a schematic cross-sectional view of the frame body taken along a line B-B of FIG. 7.

FIGS. 7 to 9 show a heat dissipation device 1 according to another embodiment of the present disclosure. The present embodiment differs from the above-described embodiment in the number of the covered CPUs and the memory modules. Since the frame body 10 of the present embodiment is formed by laterally expanding the frame body 10 of FIGS. 1 to 6 and similar in structure to the above-described embodiment, detailed description thereof is omitted herein. In an embodiment, after the airflow generated by ventilation devices 41, 42 flows through the first channel 131, it flows into the fourth channel 134. On the other hand, after the airflow generated by ventilation devices 41, 42 flows through the second channel 132 it flows into the third channel 133. That is, the first flow channel 16 and the second flow channel 17 are separate from one another. Hence, waste heat generated by the CPUs at the upwind position will not flow through the CPUs at the downwind position.

Therefore, through the design of the frame body, vertical space can be effectively utilized to guide airflow. As such, waste heat generated by the CPU at the upwind position will not adversely affect the CPU at the downwind position; and the CPU at the downwind position has a low air inlet temperature, and airflow of the ventilation devices can be completely and effectively utilized. Hence, heat dissipation units (e.g., heat dissipation fins) on the CPUs do not need to be specially designed or customized since only a portion of the airflow can be utilized, thereby effectively reducing cost and facilitating to support CPUs with high power consumption. Table 1 provides experimental data of the embodiment of FIGS. 1 to 6 and shows that the heat dissipation device of the present disclosure can effectively guide airflow for heat dissipation.

TABLE 1

| Element | Temperature without using the present disclosure | Temperature after using the present disclosure |
| --- | --- | --- |
| CPU 21 | 72.4° C. | 67.1° C. |
| Memory module 31 (first position) | 60.6° C. | 48.0° C. |
| Memory module 31 (second position) | 57.1° C. | 47.9° C. |
| Memory module 31 (third position) | 56.5° C. | 47.9° C. |
| Memory module 31 (fourth position) | 56.3° C. | 47.5° C. |
| Memory module 33 (first position) | 59.1° C. | 47.9° C. |
| Memory module 33 (second position) | 64.6° C. | 47.4° C. |
| Memory module 33 (third position) | 66.3° C. | 47.1° C. |
| Memory module 33 (fourth position) | 53.4° C. | 42.0° C. |
| CPU 22 | 80.3° C. | 67.7° C. |
| Memory module 32 (first position) | 69.5° C. | 67.4° C. |
| Memory module 32 (second position) | 65.2° C. | 65.3° C. |
| Memory module 32 (third position) | 63.3° C. | 59.7° C. |
| Memory module 32 (fourth position) | 62.3° C. | 60.3° C. |
| Memory module 34 (first position) | 81.5° C. | 63.3° C. |
| Memory module 34 (second position) | 76.3° C | 63.6° C. |
| Memory module 34 (third position) | 69.6° C. | 64.3° C. |
| Memory module 34 (fourth position) | 57.5° C. | 57.6° C. |

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:
1. A heat dissipation device, comprising:
a frame body having an airflow channel therein;
a first partition plate disposed inside the frame body for separating one side of the airflow channel into a first channel and a second channel;
a second partition plate disposed inside the frame body for separating the other side of the airflow channel into a third channel and a fourth channel;
a first flow guiding structure laterally disposed at one end of the second partition plate for isolating the fourth channel from the second channel; and
a second flow guiding structure laterally disposed at one end of the first partition plate for isolating the first channel from the third channel,
wherein the first partition plate, the first flow guiding structure, the second flow guiding structure and the second partition plate collectively form a first flow channel communicating the first channel and the fourth channel and a second flow channel communicating the second channel and the third channel, and wherein the first flow channel and the second flow channel are separate from one another.

2. The heat dissipation device of claim 1, wherein the first flow guiding structure and the second flow guiding structure each have a step-like structure.

3. The heat dissipation device of claim 2, wherein the first flow guiding structure and the second flow guiding structure are disposed adjacent to one another, and the step-like structures of the first flow guiding structure and the second flow guiding structure are positioned opposite to one another.

4. The heat dissipation device of claim 3, further comprising a first opening and a second opening formed between the first flow guiding structure and the second flow guiding structure in the first flow channel and the second flow channel, respectively, wherein the first opening and the second opening are aligned along a same vertical direction.

5. The heat dissipation device of claim 4, wherein the first flow guiding structure further has a third opening formed in the first flow channel, such that the third opening and the first opening collectively communicate the first channel and the fourth channel.

6. The heat dissipation device of claim 1, wherein the first partition plate and the second partition plate are disposed inside the frame body in a direction parallel to airflow of the airflow channel.

7. The heat dissipation device of claim 1, wherein the frame body is configured to cover at least two CPUs, and the at least two CPUs are connected in series and disposed in the first channel and the third channel, respectively, and wherein airflow through the CPU in the first channel does not flow through the CPU in the third channel.

8. The heat dissipation device of claim 1, wherein the frame body is configured to cover at least two memory modules, and the at least two memory modules are connected in series and disposed in the second channel and the fourth channel, respectively, and wherein airflow through the memory module in the second channel does not flow through the memory module in the fourth channel.

9. The heat dissipation device of claim 1, further comprising at least two ventilation devices disposed at two ends of the airflow channel, respectively.

10. The heat dissipation device of claim 9, wherein each of the ventilation devices is formed by connecting a plurality of fans in parallel.

* * * * *